United States Patent
Matsuura et al.

(10) Patent No.: US 9,494,867 B2
(45) Date of Patent: Nov. 15, 2016

(54) RINSING LIQUID FOR LITHOGRAPHY AND PATTERN FORMING METHOD USING SAME

(71) Applicant: AZ ELECTRONIC MATERIALS (LUXEMBOURG) S.A.R.L., Somerville, NJ (US)

(72) Inventors: Yuriko Matsuura, Shizouka (JP); Sara Tsuyuki, Shizouka (JP); Go Noya, Shizouka (JP)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/787,706

(22) PCT Filed: May 1, 2014

(86) PCT No.: PCT/JP2014/062046
§ 371 (c)(1),
(2) Date: Oct. 28, 2015

(87) PCT Pub. No.: WO2014/181748
PCT Pub. Date: Nov. 13, 2014

(65) Prior Publication Data
US 2016/0109805 A1    Apr. 21, 2016

(30) Foreign Application Priority Data

May 9, 2013    (JP) .................................. 2013-098979

(51) Int. Cl.
| | | |
|---|---|---|
| G03F 7/40 | (2006.01) | |
| G03F 7/32 | (2006.01) | |
| G03F 7/30 | (2006.01) | |
| G03F 7/20 | (2006.01) | |
| G03F 7/039 | (2006.01) | |
| G03F 7/038 | (2006.01) | |
| H01L 21/02 | (2006.01) | |
| H01L 21/027 | (2006.01) | |

(52) U.S. Cl.
CPC ............ *G03F 7/405* (2013.01); *G03F 7/0382* (2013.01); *G03F 7/0392* (2013.01); *G03F 7/20* (2013.01); *G03F 7/2004* (2013.01); *G03F 7/30* (2013.01); *G03F 7/32* (2013.01); *G03F 7/40* (2013.01); *H01L 21/0206* (2013.01); *H01L 21/0276* (2013.01)

(58) Field of Classification Search
None
See application file for complete search history.

(56) References Cited

U.S. PATENT DOCUMENTS

| | | | |
|---|---|---|---|
| 5,326,672 A | 7/1994 | Tanaka et al. | |
| 2002/0106589 A1 | 8/2002 | Rodney et al. | |
| 2004/0029395 A1 | 2/2004 | Zhang et al. | |
| 2005/0159322 A1* | 7/2005 | Min .................. C11D 1/721 | |
| | | | 510/175 |
| 2007/0134601 A1 | 6/2007 | Naitou et al. | |
| 2008/0193876 A1 | 8/2008 | Sawada et al. | |
| 2009/0317752 A1 | 12/2009 | Kobayashi et al. | |
| 2012/0088357 A1 | 4/2012 | Ogawa et al. | |
| 2013/0164694 A1 | 6/2013 | Wang et al. | |
| 2014/0057437 A1 | 2/2014 | Kozawa et al. | |

FOREIGN PATENT DOCUMENTS

| | | |
|---|---|---|
| JP | 5-299336 A | 11/1993 |
| JP | 7-140674 A | 6/1995 |
| JP | 10-104840 A | 4/1998 |
| JP | 2004-339226 A | 12/2004 |
| JP | 2005-43472 A | 2/2005 |
| JP | 2006-30483 A | 2/2006 |
| JP | 4045180 B2 | 11/2007 |
| JP | 2008-146099 A | 6/2008 |
| JP | 2008-180895 A | 8/2008 |
| JP | 2008-281975 A | 11/2008 |
| JP | 2012-80033 A | 4/2012 |
| JP | 2014-44298 A | 3/2014 |

(Continued)

OTHER PUBLICATIONS

JPO English abstract for JP10-104840 (Kondo) (1998).*

(Continued)

*Primary Examiner* — Sin Lee
(74) *Attorney, Agent, or Firm* — Mitchell Brustein

(57) ABSTRACT

Disclosed are a rinse solution for lithography comprising water and a nonionic surfactant represented by the formula (I) ($R_1$ and $R_2$ may be the same as or different from each other and represent a hydrogen atom or a methyl group, $R_3$ and $R_4$ may be the same as or different from each other and represent a hydrogen atom, a methyl group or an ethyl group, $R_5$ represents a hydrocarbon group having 2 to 5 carbon atoms, in which one or more of a double bond or triple bond are contained, or a phenylene group, and $R_6$ and $R_7$ may be the same as or different from each other and represent a hydrogen atom or a methyl group) and a method for forming a resist pattern by rinsing the resist pattern obtained by exposing and developing a photosensitive resist with the rinse solution for lithography described above.

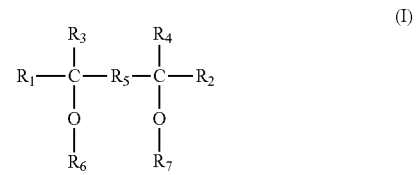

(I)

16 Claims, No Drawings

(56) References Cited

FOREIGN PATENT DOCUMENTS

| | | | |
|---|---|---|---|
| JP | 5591623 | B2 | 8/2014 |
| WO | 2006-025303 | A1 | 3/2006 |

OTHER PUBLICATIONS

Machine-assisted English translation for JP10-104840 (Kondo) (1998).*

* cited by examiner

– 1 –

RINSING LIQUID FOR LITHOGRAPHY AND PATTERN FORMING METHOD USING SAME

This application is a United States National Stage Patent Application under 35 U.S.C. §371 of International Patent Application No. PCT/JP2014/062046, filed May 1, 2014, which claims priority to Japanese Patent Application No. 2013-98979, filed May 9, 2013, the contents of which are being hereby incorporated herein by reference.

TECHNICAL FIELD

The present invention relates to a rinse solution for lithography and a method for forming a photoresist pattern using the rinse solution. More specifically, the present invention relates to a rinse solution for lithography which is used preferably and suitably in a rinse process after development of a photosensitive resin composition applied for manufacturing of a semiconductor device, a flat panel display (FPD) such as a liquid crystal display element, a color filter and so on and to a method for forming a photoresist pattern using the rinse solution.

BACKGROUND ART

In various fields such as manufacturing of semiconductor integrated circuits such as a LSI, display faces of flat panel displays (FPDs), circuit substrates, color filters, and so on, photolithography technology has so far been employed for forming fine elements or conducting fine processing. In the photolithography technology, a positive- or negative-working photosensitive resin composition (photoresist composition) is used for forming a resist pattern.

By the way, a design rule is requiring recently by micronization from a half micron to a quarter micron or further finer in the microelectronic device manufacturing trade because of a high integration tendency and a high speed tendency of LSIs. In order to respond to the further micronization of such design rule, light-exposure sources so far applied such as a visible light or near ultra violet rays (wavelength; 400 to 300 nm) are not enough and it is becoming necessary to use deep ultra violet rays such as KrF excimer laser (wavelength; 248 nm), and ArF excimer laser (wavelength; 193 nm), or a extreme ultra violet ray (EUV: wavelength; 13 nm) or a radiation having further shorter wavelength such as X-rays, electron beams and so on. Therefore, the lithography process using these light-exposure sources with shorter wavelengths has been proposed and is used in practice as a light-exposure source. In order to respond to micronization of this design rule, a photoresist having a higher resolution is being required. In addition, besides the resolution, improvements of performance such as sensitivity, a pattern shape, an accuracy of image dimension and so on are also required for the photoresist at the same time. For responding to such requirements, a chemically amplified photosensitive resin composition was proposed as a photosensitive resin composition having high resolution and high sensitivity, which is sensitive to shorter wavelength radiations. The chemically amplified photosensitive resin composition comprises, for example, a compound which can generate an acid by irradiation of radiation and a resin, polarity of which is increased by an acid. When the chemically amplified photosensitive resin composition is irradiated with radiation, an acid is generated from the acid generating compound and the polarity of the resin contained in the resist film is increased by a catalytic image formation process due to the acid generated. After this, when the resist film is developed with a developer having a high polarity (positive-type developer) such as aqueous alkaline solution, a positive image is formed and when developed with a developer having a low polarity (negative-type developer) such as an organic solvent, a negative image is formed (see Patent document 1 below).

However, as a micronization is proceeding, a problem of pattern collapse after development and rinsing in lithography process have been becoming apparent. This problem is seen notably when a patter with a high aspect ratio is formed. The aspect ratio is defined as a ratio of height of pattern to width of pattern. Specifically, it is thought that the pattern collapse is caused by that upon drying resist patterns after development, a negative pressure arises between neighboring patterns due to a surface tension of a rinse solution pooled between the neighboring patterns, the neighboring patterns are pulled in each other by the negative pressure, and differences of negative pressures generated between a plural number of neighboring patterns are caused at this time (see Patent document 2 below). From these points of view, for improving the pattern collapse when pure water with a high surface tension is used as a rinse solution, it is proposed to rinse by using not pure water but an aqueous rinse solution containing a nonionic surfactant (see Patent documents 3 to 6 below). A problem of pattern melting due to micronization of pattern, however, is shown remarkably in the known rinse solutions proposed conventionally.

CITATION LIST

Patent Documents

[Patent document 1] Japanese patent publication laid-open No. 2008-281975
[Patent document 2] Japanese patent publication laid-open No. 2012-080033
[Patent document 3] Japanese patent publication laid-open No. 2004-184648
[Patent document 4] Japanese patent publication laid-open No. Hei 05-299336
[Patent document 5] Japanese patent publication laid-open No. Hei 07-140674
[Patent document 6] Japanese patent publication laid-open No. 2008-146099

SUMMARY OF THE INVENTION

Problems to be Solved by the Invention

The present invention was performed under the situation described above. An object of the present invention, therefore, is to provide a rinse solution for lithography with a good efficiency for melting as well as good efficiencies for pattern collapse margin, defects, LWR (line width roughness) and so on like conventional rinse solution containing a surfactant, which is used preferably in a development step of a photosensitive resin composition that is used for manufacturing semiconductor devices, flat panel displays (FPDs) such as a liquid crystal display element, color filters and so on.

Further, an object of the present invention is to provide a method for forming a photoresist pattern with a good efficiency for melting as well as good efficiencies for pattern collapse margin, defects, LWR and so on by use of the rinse solution.

Means for Solving the Problems

As a result of intensive studies and investigations, the present inventors found that a rinse solution fulfilling all of the efficiencies described above could be obtained by adding a specific nonionic surfactant to a rinse solution, that is, a rinse solution with an improved melting efficiency of a resist film as well as a good pattern collapse margin, improved defects and a good LWR efficiency could be obtained and the resulting rinse solution had a good storage stabilities. The invention was made based on these findings.

The present invention relates to a rinse solution for lithography which is characterized by comprising water and a nonionic surfactant represented by the formula (I):

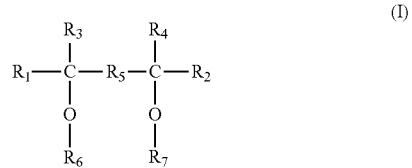

wherein, $R_1$ and $R_2$ may be the same as or different from each other and represent a hydrogen atom or a methyl group, $R_3$ and $R_4$ may be the same as or different from each other and represent a hydrogen atom, a methyl group or an ethyl group, $R_5$ represents a hydrocarbon group having 2 to 5 carbon atoms, in which one or more of a double bond or triple bond are contained, or a phenylene group, and $R_6$ and $R_7$ may be the same as or different from each other and represent a hydrogen atom or a methyl group.

Further, the present invention also relates to a method for forming a pattern, which is characterized by comprising;
(1) a step of forming a photosensitive resin composition layer by applying a photosensitive resin composition on a substrate,
(2) a step of exposing the photosensitive resin composition layer,
(3) a step of developing the photosensitive resin composition layer exposed, and
(4) a step of rinsing the developed layer with the rinse solution for lithography described above after the development.

Advantageous Effects of the Invention

Resist patterns having excellent properties for pattern collapse, defects, and LWR and not having a problem of pattern melting caused by micronization of the pattern are formed by using the rinse solution of the present invention. These effects are particularly useful when a resist pattern with high resolution is formed using a KrF excimer laser, a EUV exposure device, and the like. Further, storage stabilities of the rinse solution obtained are good.

MODE FOR CARRYING OUT THE INVENTION

Hereinafter, the present invention will be described in more detail.

The rinse solution for lithography of the present invention is characterized by containing a nonionic surfactant represented by the formula (I):

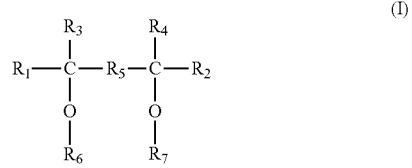

wherein, $R_1$ and $R_2$ may be the same as or different from each other and represent a hydrogen atom or a methyl group, $R_3$ and $R_4$ may be the same as or different from each other and represent a hydrogen atom, a methyl group or an ethyl group, $R_5$ represents a hydrocarbon group with 2 to 5 carbon atoms, in which one or more of a double bond or triple bond are contained, or a phenylene group, and $R_6$ and $R_7$ may be the same as or different from each other and represent a hydrogen atom or a methyl group.

In the formula (I) above, as the hydrocarbon group with 2 to 5 carbon atoms, in which one or more of a double bond or triple bond are contained, there are exemplified, for example, —CH=CH—, —C≡C—, —C≡C—CH$_2$—C≡C—, and the like.

It is preferred that the nonionic surfactant represented by the formula (I), which is used in the present invention, has 5,000 ppm or more of a maximum dissolution quantity in water of 25° C. In addition, the maximum dissolution quantity is defined as the maximum dissolution mass (ppm) of the additive, all of which are dissolved completely in water of 25° C. when added to the water, relative to the total mass of water and the additive added to water. The pattern collapse and the roughness characteristics can be improved by increasing the amount of the nonionic surfactant dissolved in the rinse solution. If the maximum dissolution quantity of the nonionic surfactant is large, any amount of the nonionic surfactant, which is needed for improving the characteristics of the rinse solution, can be easily contained in the rinse solution. Furthermore, it is also preferred that the maximum dissolution quantity of the nonionic surfactant is large because special considerations to the storage stability of the rinse solution are not needed.

In the rinse solution of the present invention, the content of the nonionic surfactant represented by the aforementioned formula (I) can be determined arbitrarily depending on the kind of the nonionic surfactant used, the kind of resist processed with the rinse solution, and so on. The content is preferably 0.02 to 0.5% by mass (200 to 5,000 ppm) relative to the total mass of the rinse solution generally, more preferably 0.05 to 0.3% by mass (500 to 3,000 ppm). If the content is less than 0.02% by mass, problems of lowering of pattern collapse margin and roughness tend to occur strongly. On the contrary, if the content is more than 0.5% by mass (5,000 ppm), a problem that gel defect often occurs tends to come out. For example, if the maximum dissolution quantity of the surfactant in water of 25° C. is less than 500 ppm, problems concerning occurrence of gel defects and shelf life of the rinse solution will occur when the surfactant is added to a rinse solution in an amount beyond the dissolvable amount by considering improvement of properties such as pattern collapse, roughness, an anti-melting effect, and so on.

Typical examples of the nonionic surfactant represented by the formula (I), which can be preferably used in the present invention, include following compounds. However, the nonionic surfactants represented by the formula (I), which can be used in the invention, are not limited to these compounds described below.

First, as the nonionic surfactants wherein $R_5$ is a hydrocarbon group with 2 to 5 carbon atoms, that contains one or more of a double bond or triple bond, there are exemplified, for example, 3-hexene-2,5-diol, 1,4-butynediol, 3-hexyne-2,5-diol, 2,5-dimethyl-3-hexyne-2,5-diol, 3,6-dimethyl-4-octyn-3,6-diol, 2,4-hexadiyn-1,6-diol, etc.

Example of the nonionic surfactants wherein $R_5$ is a phenylene group, include 1,2-benzendimethanol, 1,3-benzendimethanol, p-xylylene glycol, 1,4-bis(methoxymethyl)benzene, and the like.

The rinse solution for lithography of the present invention may further contain additives as needed. As such additives, an acid, a base, an organic solvent, other water-soluble compounds etc. may be raised.

The acid or base may be used for adjusting a pH value of a process liquid or improving solubility of additive components. The acid and base may be selected from any compounds within the effects of the present invention being not spoiled. Carboxylic acids, amines, and ammonium compounds are raised as the acid and base, for example. These include fatty acids, aromatic carboxylic acids, primary amines, secondary amines, tertiary amines, and ammonium compounds and these compounds may be substituted by any substituent. More specifically, formic acid, acetic acid, propionic acid, benzoic acid, phthalic acid, salicylic acid, lactic acid, malic acid, citric acid, oxalic acid, malonic acid, succinic acid, fumalic acid, maleic acid, aconitic acid, glutaric acid, adipic acid, monoethanol amine, diethanolamine, triethanolamine, triisopropanolamine, ethylenediamine, diethylenetriamine, pentaethylenehexamine, piperizine, piperazine, morpholine, tetramethylammonium hydroxide, and so on are raised. The preferable amount of the acid added is, but are not limited to, 0.005% by mass to 0.1% by mass (50 ppm to 1,000 ppm) relative to the total amount of the rinse solution usually. The preferable amount of the base added is, but are not limited to, 0.01% by mass to 0.3% by mass (100 ppm to 3,000 ppm) relative to the total amount of the rinse solution usually.

In the rinse solution of the present invention, organic solvents except water may be used as a co-solvent. The organic solvents have a function adjusting a surface tension of the rinse solution and sometimes can improve wettability to a surface of the resist. Organic solvents used for accomplishing these purposes are selected from water soluble organic solvents. specific examples of the water soluble organic solvents include alcohols such as methyl alcohol, ethyl alcohol, isopropyl alcohol, and t-butyl alcohol; glycols such as ethylene glycol and diethylene glycol; ketones such as acetone and methyl ethyl ketone; esters such as methyl acetate, ethyl acetate, and ethyl lactate; dimethylformamide, dimethylacetamide, dimethylsulfoxide, methyl cellosolve, cellosolve, butyl cellosolve, cellosolve acetate, alkyl cellosolve acetate, propylene glycol alkyl ether, propylene glycol alkyl ether acetate, butyl carbitol, carbitol acetate, and tetrahydrofuran.

As these organic solvents sometimes dissolve or denature a resist which constitutes the pattern, the amount is limited to a little when used. Specifically, the content of the organic solvent is usually less than 5% by mass relative to the total mass of the rinse solution, preferably less than 1% by mass, more preferably 0.01 to 0.3% by mass (100 to 3,000 ppm), but it is preferred that no organic solvent uses for the purpose of preventing dissolution or denaturation of the resist.

Further, as other water-soluble compounds, there are exemplified water-soluble compounds used for improving the dissolution of additive components. As examples of these water-soluble compounds, surfactants excluding the surfactants represented by the aforementioned formula (I) are raised, for example. These other surfactants may be any one of nonionic surfactants, cationic surfactants, anionic surfactants, and amphoteric surfactants. Of these, nonionic surfactants are preferred. Specifically, Surfynol manufactured by Nissin Chemical Industry Co., Ltd. ('Surfynol' is a registered trade mark.) and ADEKA Pluronic manufactured by ADEKA CORPORATION ('ADEKA' is a registered trade mark.) are raised. The amount of other surfactants is preferably 0.01% by mass to 0.3% by mass (100 ppm to 3,000 ppm) relative to the total mass of the rinse solution usually.

An antimicrobial, an antibacterial, an antiseptic, and/or a fungicide may be contained in the rinse solution for lithography of the present invention. These chemicals are used for preventing bacteria and fungi from propagating in an elapsed rinse solution. Examples of these chemicals include alcohols such as phenoxyethanol and isothiazolone. Bestcide (trade name) available from NIPPON SODA CO., LTD. is a particularly effective antimicrobial, antibacterial, and fungicide. These chemicals have no influence on properties of the rinse solution for lithography typically. The amount of these chemicals added is usually 0.0001% by mass to 1% by mass (1 ppm to 10,000 ppm), preferably 0.001% by mass to 0.1% by mass (10 ppm to 1,000 ppm) relative to the total mass of the rinse solution The rinse solution for lithography of the present invention is a rinse solution for lithography in which a nonionic surfactant represented by the aforementioned formula (I) and other components as needed are dissolved in water which is a solvent. The rinse solution for lithography of the present invention is filtered with a filter if necessary to remove insolubles after components constituting the rinse solution were dissolved.

Next, a method for forming a pattern according to the present invention will be explained below. A lithography step in the pattern forming method of the present invention may be any one of methods wherein resist patterns are formed using known positive-working or negative-working photosensitive resin composition which can be developed with an alkali aqueous solution. As a typical pattern forming method in which the rinse solution of the present invention is applied, a following method is raised.

First, a photosensitive resin composition is applied on a surface of a substrate such as a silicon wafer or a glass plate, which is preprocessed as needed, with a so far known coating method to form a photosensitive resin composition layer. An anti-reflection film may be formed on the substrate by application before the application of the photosensitive resin composition, or may be formed on the photosensitive resin composition layer formed by application. The cross-sectional shape of the resist pattern and the exposure margin of the photosensitive resist composition can be improved by forming the anti-reflection film as an upper or lower layer of the photosensitive resist composition layer.

Typical examples of the known positive-working or negative-working photosensitive resin composition which can be developed by an alkaline developer used in the pattern forming method of the present invention include a photosensitive resin composition comprising a quinone diazide photosensitizer and an alkali-soluble resin, a chemically amplified photosensitive resin composition and so on. The chemically amplified photosensitive resin composition is preferred from the viewpoint of forming a fine resist pattern with a high resolution.

Examples of the quinone diazide compound, which is used in a positive-working photosensitive resin composition comprising a quinone diazide photosensitizer and an alkali-soluble resin, include 1,2-benzoquinonediazide-4-sulfonic acid, 1,2-naphthoquinonediazide-4-sulfonic acid, 1,2-naphthoquinonediazide-5-sulfonic acid, and esters or amides of these sulfonic acids. Examples of the alkali-soluble resin described above include a novolak resin, polyvinylphenol, polyvinylalcohol, and a copolymer of acrylic acid or methacrylic acid. As preferred novolak resins, novolak resins which were prepared from one or more kinds of phenols such as phenol, o-cresol, m-cresol, p-cresol, xylenol and so on and one or more kinds of aldehydes such as formaldehyde, paraformaldehyde and so on are raised.

Any conventionally known chemically amplified photosensitive resin composition may be used as the chemically amplified photosensitive resin composition. As the known chemically amplified photosensitive resin composition, there are exemplified a positive-working type chemically amplified photosensitive resin composition comprising a compound which generates an acid by irradiation of actinic light or radiation (photo-acid generator) and a resin, polarity of which is increased by the action of an acid generated from the photo-acid generator and as a result, solubility for developer of which changes in an exposed area and a non-exposed area or a negative-working type chemically amplified photosensitive resin composition comprising an alkali soluble resin, a photo-acid generator, and a crosslinking agent, wherein crosslinking of the resin by the crosslinking agent is caused by an action of an acid generated from the photo-acid generator and as a result, solubility for developer changes in an exposed area and a non-exposed area.

As the aforementioned resin, polarity of which is increased by the action of an acid and as a result, solubility for developer of which changes in an exposed area and a non-exposed area, there are exemplified resins having a group which generates an alkali soluble group by decomposition caused by the action of an acid in a main chain or a side chain or both of a main chain and a side chain. Representative examples thereof include a polymer, in which an acetal or ketal group is introduced into a hydroxystyrene-type polymer (PHS) as a protective group (for example, Japanese patent publication laid-open Nos. Hei 02-141636, Hei 02-019847, Hei 04-219757, and Hei 05-281745); a polymer similar to the aforementioned polymer, into which a t-butoxycarbonyloxy group or a p-tetrahydropyranyloxy group is introduced as an acid decomposition group (Japanese patent publication laid-open Nos. Hei 02-209977, Hei 03-206458, and Hei 02-019847); a polymer in which a monomer having a carboxylic acid part such as acrylic acid or methacrylic acid or a monomer having a hydroxyl group or a cyano group in a molecular is copolymerized with a monomer having an alicyclic hydrocarbon group; and an acid responsible resin having an alkali insoluble group protected by a structure containing an alicyclic group and a structure unit which makes the alkali insoluble group alkali-soluble by releasing the protective group by the action of an acid (Japanese patent publication laid-open Nos. Hei 09-073173, Hei 09-090637, and Hei 10-161313).

Further, as the photo-acid generator, any compounds may be used as long as the compound can generate an acid by irradiation of actinic rays or radiation. Examples thereof include onium salts such as a diazonium salt, an ammonium salt, a phosphonium salt, a iodonium salt, a sulfonium salt, a selenonium salt, and an arsonium salt, organic halogen compounds, organic metal/organic halogen compounds, photo-acid generators having an o-nitrobenzyl type protective group, compounds generating a sulfonic acid by photodecomposition, which is typically represented by iminosulfonate, etc. Furthermore, compounds in which a group or compound generating an acid by irradiation of radiation is introduced into a main chain or side chain of a polymer may be used too.

Further, acid-degradable dissolution inhibiting compounds, dyes, plasticizers, surfactants, photosensitizers, organic basic compounds, and compounds accelerating solubility in developer may be contained in the chemically amplified photosensitive resin composition, as needed.

The photosensitive resin composition is applied on a substrate such as a silicon wafer or a glass plate, on which an anti-reflection film is provided if necessary, by using an appropriate coating machine such as a spinner and an appropriate coating method. The photosensitive resin composition applied is then prebaked, for example, on a hot plate and as a result, solvent containing in the photosensitive resin composition is removed to form a photoresist film. The temperature of prebaking may be usually 70° C. to 150° C., preferably 90° C. to 150° C. for 10 seconds to 180 seconds, preferably 30 seconds to 90 seconds when on a hot plate or for 1 minute to 30 minutes when in a clean oven, though it varies by a solvent or resist composition used. The photoresist film prebaked is exposed using known exposure machines such as a high pressure mercury lamp, a metal halide lamp, an ultra high pressure mercury lamp, a KrF excimer laser, an ArF excimer laser, a EUV irradiation device, a soft X-rays irradiation device, an electron drawing equipment etc. through a predetermined mask as needed. After the post-exposure bake (PEB), it was developed with a developer.

As a developing method, there may be adopted any methods, for example, a paddle developing method etc. As a developer, an alkaline developer is adopted usually. Examples of the alkaline developer include a water or aqueous solution of sodium hydroxide, tetramethylammonium hydroxide (TMH) and the like. Just after development, the resist pattern formed is rinsed (cleaned) with a rinse solution of the present invention.

In the pattern forming method according to the present invention, a contact time of the rinse solution for lithography with a resist substrate, that is, a processing time is not limited particularly but the effect of the invention usually appears by making the processing time within one second or less. The processing temperature may also be any temperatures. Further, a method of bringing the rinse solution into contact with a resist may be any method. As examples thereof, a method of immersing a resist substrate in a rinse solution and a method of dripping a rinse solution onto a spinning resist substrate are given.

In the pattern forming process of the present invention, after development, a cleaning treatment with pure water may be conducted before treated with a rinse solution of the present invention and/or after treated with a rinse solution of the present invention. The former cleaning treatment is conducted for cleaning a developer which is attached to a resist pattern and the latter cleaning treatment is conducted for cleaning the rinse solution used. The method of rinse treatment with a rinse solution of the present invention may be any rinse treatment method conventionally known. For example, it can be conducted by immersing a resist substrate in a rinse solution or dripping a rinse solution onto a spinning resist substrate. These methods may be combined properly.

The pattern forming method of the invention has not problems of a pattern collapse margin, defects, and LWR, and in particular, pattern collapse and melting in a fine resist pattern with a high aspect ratio can be improved effectively by using the pattern forming method of the invention. Here, the aspect ratio is defined as a ratio of height of the resist pattern to width of the resist pattern. It is, therefore, preferred that the pattern forming method of the present invention include a lithography step in which a fine resist pattern is formed, that is, a lithography step containing an exposure in which an exposure wavelength of 250 nm or less by a KrF excimer laser, an ArF excimer laser, an EUV, X-rays, electron beams or the like is used as an exposure light. Furthermore, about a pattern dimension of a resist pattern it is preferred to contain a lithography step forming a resist pattern with 300 nm or less of a line width for a line and space pattern, a trench width for a trench pattern, a hole diameter for a contact hole pattern, or a dot diameter for a dot pattern. Particularly, in forming of a ultra fine pattern by exposing a chemically amplified photosensitive resin composition with an extreme ultra violet ray (EUV), a lithography using a rinse solution of the present invention can be used preferably from the point of view of prevention of pattern melting, prevention of pattern collapse, improvement of collapse limit critical dimension, and the like.

The resist pattern formed by the method of the present invention can be used for a resist for etching, plating, ion diffusion treatment, and dyeing processing, for example. The resist film is peeled off as needed after processing.

EXAMPLES

Hereinafter, the present invention will be specifically described with reference to Examples and Comparative examples, but the present invention is not restricted to these descriptions.

Example 1

A bottom anti-reflective firm composition AZ Kr-F 17B ("AZ" is a registered trade mark) manufactured by AZ Electronic Materials Manufacturing (Japan) K. K. was spin-coated on a silicon wafer and baked at 180° C. for 60 seconds to prepare an anti-reflective film of 80 nm in thickness on the wafer. Next, a chemically amplified ArF resist composition AZ DX6270P manufactured by AZ Electronic Materials Manufacturing (Japan) K. K. was spin-coated on the anti-reflective film and soft-baked at 120° C. for 90 seconds to form a resist film of 620 nm in thickness. After that, the wafer obtained was exposed to light by a KrF-exposure device FPA3000-EX5 (NA=0.63/1/2 Ann., Mask: HTPSM 6%) manufactured by Canon Inc. through a 150 nm mask size (L:S=1:1) while increasing an amount of exposure. It was then post-exposure baked (PEB) at 130° C. for 90 seconds and paddle-developed with AZ 300 MIF developer (2.38% TMAH aqueous solution) manufactured by AZ Electronic Materials Manufacturing (Japan) K.K. for 60 seconds. Rinse water was begun to pour into a puddle of the developer on a wafer, pouring thereof was continued while rotating the wafer to replace the developer with the rinse water, and the rotation of the wafer was stopped in a puddled state by water. Subsequently a rinse solution consisting of deionized water containing 1,000 ppm of 3-hexene-2,5-diol (HXED) was introduced into the paddle of water and the wafer was rotated at very high speed to dry it.

For the evaluation of a critical dimension in collapse limit, the pattern formed was observed by an electron microscope S9220 manufactured by Hitachi, Ltd. At this time, a line width of a pattern relative to an amount of exposure was measured and the line width just before collapse was made a critical dimension (collapse limit CD). The result is shown in Table 1. The pattern collapse margin is improved in comparison with when deionized water was used as a rinse solution (see Comparison example 1 described below).

Furthermore, gel defects by the rinse solution were confirmed and evaluated by following methods. The results are shown in Table 1.
<Confirmation and Evaluation of Gel Defects>

A chemically amplified KrF resist composition AZ DX6270P manufactured by AZ Electronic Materials Manufacturing (Japan) K. K. is spin-coated on a silicon wafer and soft-baked at 120° C. for 90 seconds to form a resist film of 620 nm in thickness. A rinse solution filtered with a filter is applied on the resist film obtained and the wafer is rotated at a very high speed to dry it. A defect inspection therefor whether there is a gel defect is conducted using a defect inspection apparatus KLA2360 manufactured by KLA Tencor corporation and confirmed with an apparatus RS5500 manufactured by Hitachi High-Technologies, Ltd. As a result, when no gel defect exists on the resist film, it is evaluated as 'O' and when a gel defect exists on the resist, it was evaluated as 'X'.

No gel defect was observed about the rinse solution used in Example 1. The evaluation of the rinse solution of Example 1 falls under 'O'.

Furthermore, storage stabilities of the rinse solution used in Example 1 were tested by the following method. The result is shown in Table 1.
<Storage Stability Test of Rinse Solution>

A rinse solution prepared in a predetermined concentration is filtered through a filter and left at rest at 25° C. for one month. A chemically amplified KrF resist composition AZ DX6270P manufactured by AZ Electronic Materials Manufacturing (Japan) K. K. is spin-coated on a silicon wafer and soft-baked at 120° C. for 90 seconds to form a resist film of 620 nm in thickness. The rinse solution after preservation is applied on the resist film and the wafer is rotated at a very high speed to dry it. The total defect numbers of all defects including gel defects and particle defects on this film are measured using a defect inspection apparatus KLA2360 manufactured by KLA Tencor corporation. The number of defects when the preserved test rinse solution is used as a rinse solution is compared with that when the preserved rinse solution consisting of only a deionized water is used (see Comparative example 1) and when the defect number of the test rinse solution is equal to or less than that of the rinse solution of the deionized water, it is evaluated as 'O' and when the number is more than that of the deionized water, it is evaluated as 'X'.

In addition, the defect number of the rinse solution after preservation of the rinse solution according to Example 1 was less than that of the rinse solution consisting of deionized water. The evaluation of the rinse solution of Example 1 falls under 'O'.

Further, the maximum dissolution quantity of 3-hexene-2,5-diol (HXED) in water of 25° C. and a surface tension of the rinse solution were measured by following methods. The results are shown in Table 1.
[Measurement and Evaluation of Maximum Dissolution Quantity]

Different amounts of an additive agent for a rinse solution are added between transparent screws and in each cases water is further added as the total amount of the additive agent and water is made 100 g. These are mixed at 25° C. for 10 hours or more by using a stealer and left at rest for some time at this temperature. The state of dissolution thereof is observed by eyes and the maximum amount of the additive agent wherein insoluble matter is not observed in the solution is defined as a maximum dissolution quantity (ppm).

The maximum dissolution quantity of 3-hexene-2,5-diol (HXED) in water of 25° C. was more than 10,000 ppm.
<Measurement of Surface Tension>

A surface tension measurement of a prepared rinse solution was conducted using the surface tensiometer CBVP-Z manufactured by Kyowa interface science Co., LTD.

The surface tension of the rinse solution containing 1,000 ppm of 3-hexene-2,5-diol (HXED) was 66.5 mN/m.

Examples 2 to 10

Resist patterns were formed in the same manner as in Example 1 except for using respectively a nonionic surfactant, 3,6-dimethyl-4-octyn-3,6-diol (DMOD) (Example 2), 2,4-hexadiyn-1,6-diol (HXDD) (Example 3), 1,4-butynediol (BTD) (Example 4), 2,5-dimethyl-3-hexyne-2,5-diol (DMHD) (Example 5), 3-hexyne-2,5-diol (HXYD) (Example 6), 1,4-bis(methoxymethyl)benzene (DMPX) (Example 7), p-xylylene glycol (PXG) (Example 8), 1,2-benzendimethanol (OXG) (Example 9), or 1,3-benzendimethanol (MXG) (Example 10) instead of a nonionic surfactant 3-hexene-2,5-diol (HXED). The critical dimensions of collapse limit of the resist patterns formed were evaluated in the same manner as in Example 1.

Further, gel defects when using the rinse solutions in Examples 2 to 10 were confirmed and evaluated in the same manner as in Example 1. Furthermore, storage stabilities of the rinse solutions used in Examples 2 to 10 were tested in the same manner as in Example 1. The results are shown in Table 1. In addition to these characteristic tests, maximum dissolution quantities in water of 25° C. of surfactants added in Examples 2 to 10 and surface tensions of the rinse solutions used in Examples 2 to 10 were measured in the same manner as in Example 1. The results are shown in Table 1.

solution. The critical dimension of collapse limit of the resist pattern formed was evaluated in the same manner as in Example 1. The result is shown in Table 2. The critical dimension of collapse limit (collapse limit CD) of the resist pattern formed was more than 200 nm.

Further, gel defects of the rinse solution (deionized water) used in Comparative example 1 was confirmed and evaluated in the same manner as in Example 1. The result is shown in Table 2. In addition, there was measured a number of defects when deionized water left a rest at 25° C. for one month as described in <Storage stability test of rinse solution> of Example 1 was used as a rinse solution. The number was made a reference defect number. The reference defect number was 210.

Comparative Examples 2 to 8

Resist patterns were formed in the same manner as in Example 1 except for using respectively 500 ppm of Surfynol 104 (SF104) manufactured by Nissin Chemical Industry Co., Ltd. ('Surfynol' is a registered trade mark) (Comparative example 2), 1,000 ppm of Surfynol 104 (SF104) manufactured by Nissin Chemical Industry Co., Ltd. (Comparative example 3), 1,000 ppm of 3,8-dioxa-5-decyne-4,7-diol (DODD) (Comparative example 4), 1,000 ppm of 1,4-cyclohexanedimethanol (CHDM) (Comparative example 5), 1,000 ppm of 1,4-butanediol (Comparative example 6), 1,000 ppm of Surfynol 404 (SF404) manufactured by Nissin Chemical Industry Co., Ltd. (Comparative example 7), and 1,000 ppm of Surfynol 485 (SF485) manufactured by Nissin Chemical Industry Co., Ltd. (Comparative example 8) instead of 1,000 ppm of a nonionic surfactant 3-hexene-2,5-diol (HXED). The critical dimensions of collapse limit of the resist patterns formed were evaluated in the same manner as in Example 1. The results are shown in Table 2.

TABLE 1

| Example | Additives of rinse solution | Amount (ppm) | Collapse limit CD (nm) | Gel defects | Storage stabilities | Maximum dissolution quantity of additives in water | Surface tension of rinse solution (mN/m) |
|---|---|---|---|---|---|---|---|
| 1 | HXED | 1,000 | 158 | ○ | ○ | >10,000 ppm | 66.5 |
| 2 | DMOD | 1,000 | 136 | ○ | ○ | >10,000 ppm | 56.9 |
| 3 | HXDD | 1,000 | 185 | ○ | ○ | >10,000 ppm | 72.7 |
| 4 | BTD | 1,000 | 177 | ○ | ○ | >10,000 ppm | 72.9 |
| 5 | DMHD | 1,000 | 156 | ○ | ○ | >10,000 ppm | 65.5 |
| 6 | HXYD | 1,000 | 162 | ○ | ○ | >10,000 ppm | 70.5 |
| 7 | DMPX | 1,000 | 184 | ○ | ○ | >5,000 ppm | 64.0 |
| 8 | PXG | 1,000 | 194 | ○ | ○ | >10,000 ppm | 71.5 |
| 9 | OXG | 1,000 | 198 | ○ | ○ | >10,000 ppm | 72.6 |
| 10 | MXG | 1,000 | 197 | ○ | ○ | >10,000 ppm | 71.3 |

As shown Table 1, by use of the rinse solutions of Examples 1 to 10 according to the present invention, every critical dimensions of collapse limit thereof were improved compared to when using the deionized water (see Comparative example 1 below), no gel defect was observed in the rinse solutions of Examples 1 to 10, and storage stabilities thereof were good. The maximum dissolution quantities in water of 25° C. of surfactants used in Examples 2 to 10 except for Example 7 were more than 10,000 ppm but that of 4-bis(methoxymethyl)benzene (DMPX) used in Example 7 was more than 5,000 ppm. Like this, every maximum dissolution quantities of these surfactants were large.

Comparative Example 1

A resist patter was formed in the same manner as in Example 1 except for using deionized water as a rinse Further, gel defects of the rinse solutions used in Comparative examples 2 to 8 were confirmed and evaluated in the same manner as in Example 1. Furthermore, storage stabilities of the rinse solutions used in Comparative examples 2 to 8 were tested in the same manner as in Example 1. In addition to these, maximum dissolution quantities in water of 25° C. of additives used in Comparative examples 2 to 8 and surface tensions of the rinse solutions used in Comparative examples 2 to 8 were measured in the same manner as in Example 1. The results are shown in Table 2.

In addition, Surfynol 104 is 2,4,7,9-tetramethyl-5-decyne-4,7-diol, Surfynol 404 is a 3.5 mole ethylene glycol additive material of Surfynol 104, and Surfynol 485 is a 30 mole ethylene glycol additive material of Surfynol 104.

TABLE 2

| Comparative example | Additives of rinse solution | Amount (ppm) | Collapse limit CD (nm) | Gel defects | Storage stabilities | Maximum dissolution quantity of additives in water | Surface tension of rinse solution (mN/m) |
|---|---|---|---|---|---|---|---|
| 1 | none | 0 | >200 | ○ | — | — | 72.1 |
| 2 | SF104 | 500 | 150 | X | X | <500 ppm | 37.0 |
| 3 | SF104 | 1,000 | Occurrence of gel | X | X | <500 ppm | 32.7 |
| 4 | DODD | 1,000 | 210 | ○ | ○ | >10,000 ppm | 72.1 |
| 5 | CHDM | 1,000 | 206 | ○ | ○ | >10,000 ppm | 71.9 |
| 6 | 1,4-butanediol | 1,000 | 197 | ○ | ○ | >10,000 ppm | 72.4 |
| 7 | SF440 | 1,000 | 129 | ○ | ○ | <1,500 ppm | 35.5 |
| 8 | SF485 | 1,000 | 125 | X | ○ | >10,000 ppm | 31.3 |

As shown in Table 2, in rinse solutions of Comparative examples 2 and 3, there were observed occurrence of gel and gel defects possibly caused by that the maximum dissolution quantity in water of 25° C. of SF104 is as low as less than 500 ppm. Further, storage stabilities thereof were bad for the same reason. When the rinse solution of Comparative example 8 was used, occurrence of gel was observed although the maximum dissolution quantity of the additive in water of 25° C. was as large as more than 10,000 ppm. In addition, although not described in Table 2, storage stabilities of DODD and SF485 used in the rinse solutions of Comparative examples 4 and 8 were 'X' when the additive concentrations were more than 3,000 ppm. Furthermore, SF440 used in Comparative example 7 could not use in concentration of more than 1,500 ppm, as SF440 had a maximum dissolution quantity of less than 1,500 ppm.

From Tables 1 and 2, on properties such as the collapse limit critical dimension, defects, and storage stabilities, performances equal to or better than that of the conventional rinse solution containing the nonionic surfactants were obtained by use of the nonionic surfactant represented by the formula (I) according to the present invention. On the other hand, rinse solutions containing surfactants with inferior solubility in water, which were used in Comparative examples, had problems of storage stabilities of rinse solutions and generation of gel defects. Furthermore, even though rinse solutions of Comparative examples had no problem of solubility in water, some of the rinse solutions had a problem of gel defects or storage stabilities. That is, there was obtained a result that many conventional rinse solutions containing a surfactant were not able to solve the problems of the collapse limit critical dimension, defects, and storage stabilities at the same time.

Example 11

A bottom anti-reflective firm composition AZ Kr-F 17B manufactured by AZ Electronic Materials Manufacturing (Japan) K. K. was spin-coated on a silicon wafer and baked at 180° C. for 60 seconds to prepare an anti-reflective film of 60 nm in thickness on the wafer. Next, a chemically amplified PHS-acrylate hybrid EUV resist composition was spin-coated on the anti-reflective film and soft-baked at 100° C. for 90 seconds to form a resist film of 80 nm in thickness. The wafer obtained was exposed to light by a KrF-exposure device FPA3000-EX5 (NA=0.63/Quadro. Mask: HTPSM 6%) manufactured by Canon Inc. through a mask with 150 nm mask size (L:S=1:1) while increasing an amount of exposure. It was then post-exposure baked (PEB) at 70° C. for 90 seconds and paddle-developed with AZ 300 MIF developer (2.38% TMAH aqueous solution) manufactured by AZ Electronic Materials Manufacturing (Japan) K.K. for 30 seconds. Rinse water was then begun to pour into a paddle of the developer on a wafer, pouring thereof was continued while rotating the wafer to replace the developer with the rinse water, and the rotation of the wafer was stopped in a puddled state by water. Subsequently, a rinse solution consisting of deionized water containing 1,000 ppm of 3-hexene-2,5-diol (HXED) was introduced into the paddle of water and the wafer was rotated at very high speed to dry it.

Pattern shapes with 100 nm or less in width of the pattern formed was observed by an electron microscope S9220 manufactured by Hitachi, Ltd. and evaluated by the evaluation criteria below. The result is shown in Table 3.

<Evaluation Criteria of Melting>

When the rectangle of a pattern was retained and change of linewidth was 10 nm or less, melting was evaluated as 'Nonexistence' and when not retained, melting was evaluated as 'Existence'.

No melting existed in the pattern formed in Example 11. The evaluation thereof was 'Nonexistence'.

LWR was measured and evaluated by the method below. The result is shown in Table 3.

<Length Measurement and Evaluation of LWR>

A chemically amplified PHS-acrylate hybrid EUV resist film with 80 nm in thickness was formed on a silicon wafer in the same manner as in Example 11. Next, a pattern was formed with a shot (dose: 80 mJ/cm$^2$) in which pattern CD (critical dimension) was near 100 nm through 150 nm mask size on a mask with L/S=1/1, followed by measuring LWR with an electron microscope 59220 manufactured by Hitachi, Ltd. The value of LWR of Example was compared with the value (6.0 nm) of LWR when deionized water was used as a rinse solution and if the value thereof was improved, it was evaluated as 'Improved' and if not improved, it was evaluated as 'Not improved'. Further, when the evaluation is not able to conduct due to occurrence of gel or melting, it was evaluated as 'Gel occurrence' or 'Melting'.

Examples 12 to 20

Resist patterns were formed in the same manner as in Example 11 except for using respectively a nonionic surfactant, 3,6-dimethyl-4-octyn-3,6-diol (DMOD) (Example 12), 2,4-hexadiyn-1,6-diol (HXDD) (Example 13), 1,4-butynediol (BTD) (Example 14), 2,5-dimethyl-3-hexyne-2,5-diol (DMHD) (Example 15), 3-hexyne-2,5-diol (HXYD) (Example 16), 1,4-bis(methoxymethyl)benzene (DMPX) (Example 17), p-xylyleneglycol (PXG) (Example 18), 1,2-benzendimethanol (OXG) (Example 19), or 1,3-benzendimethanol (MXG) (Example 20) instead of a nonionic surfactant 3-hexene-2,5-diol (HXED). The existence or nonexistence of melting and LWR of resist patterns formed were measured and evaluated in the same manner as in Example 11. The results are shown in Table 3.

TABLE 3

| Example | Additives of rinse solution (solvent: deionized water) | Amount (ppm) | Existence or nonexistence of melting | LWR |
|---|---|---|---|---|
| 11 | HXED | 1,000 | Nonexistence | Improved |
| 12 | DMOD | 1,000 | Nonexistence | Improved |
| 13 | HXDD | 1,000 | Nonexistence | Improved |
| 14 | BTD | 1,000 | Nonexistence | Improved |
| 15 | DMHD | 1,000 | Nonexistence | Improved |
| 16 | HXYD | 1,000 | Nonexistence | Improved |
| 17 | DMPX | 1,000 | Nonexistence | Improved |
| 18 | PXG | 1,000 | Nonexistence | Improved |
| 19 | OXG | 1,000 | Nonexistence | Improved |
| 20 | MXG | 1,000 | Nonexistence | Improved |

As obvious from Table 3, in all of Examples 11 to 20, no melting existed and LWR was improved as compared with when deionized water was used as a rinse solution (see Comparative example 9).

Comparative Example 9

A resist pattern was formed in the same manner as in Example 11 except for using deionized water as a rinses solution. Existence of melting in the pattern formed was evaluated in the same manner as in Example 11. The value of LWR was also measured in the same manner as in Example 11. The results are shown in Table 4. In addition, the LWR when deionized water was used as a rinse solution was 6.0 nm.

Comparative Examples 10 to 16

Resist patterns were formed in the same manner as in Example 11 except for using respectively 500 ppm of Surfynol 104 (SF104) (Comparative example 10), 1,000 ppm of Surfynol 104 (SF104) (Comparative example 11), 1,000 ppm of 3,8-dioxa-5-decyne-4,7-diol (DODD) (Comparative example 12), 1,000 ppm of 1,4-cyclohexanedimethanol (CHDM) (Comparative example 13), 1,000 ppm of 1,4-butanediol (Comparative example 14), 1,000 ppm of Surfynol 440 (SF440) (Comparative example 15), and 1,000 ppm of Surfynol 485 (SF485) (Comparative example 16) instead of 1,000 ppm of a nonionic surfactant 3-hexene-2,5-diol (HXED). Existence of melting in the patterns formed and LWR of the pattern formed were measured and evaluated in the same manner as in Example 11. The results are shown in Table 4.

TABLE 4

| Comparative example | Additives of rinse solution (solvent: deionized water) | Amount (ppm) | Existence or nonexistence of melting | LWR |
|---|---|---|---|---|
| 9 | none | 1,000 | Nonexistence | (6.0 nm) |
| 10 | SF104 | 500 | Nonexistence | Improved |
| 11 | SF104 | 1,000 | Occurrence of gel | Occurrence of gel |
| 12 | DODD | 1,000 | Existence | (Melting) |
| 13 | CHDM | 1,000 | Existence | (Melting) |
| 14 | 1,4-butane-diol | 1,000 | Existence | (Melting) |
| 15 | SF440 | 1,000 | Existence | (Melting) |
| 16 | SF485 | 1,000 | Rxistence | (Melting) |

From Table 4, in Comparative example 11 using a rinse solution containing SF104, maximum dissolution quantity in water of 25° C. of which was less than 500 ppm (see Table 2), gel occurred because the addition amount of SF104 greatly exceeded the maximum dissolution quantity of SF104 (500 ppm). The rinse solution of Comparative example 11, therefore, was not able to use as a rinse solution. Further, melting generated in Comparative examples 12 to 16. In addition, in Comparative example 10 wherein a rinse solution containing 500 ppm of SF104 was used, there were problems that gel defects arose and storage stabilities were wrong as shown in Table 2 though melting did not occur and LWR was improved.

As described above, it is found from Tables 1 to 4 that by use of the nonionic surfactants represented by the formula (1) of the present invention, properties, for example, pattern collapse margin, defects, LWR, and so on are improved and those properties are almost equally with or more than those when rinse solutions containing conventional nonionic surfactants are used, a problem of pattern melting, which becomes evident when forming a fine pattern conventionally, is also improved at the same time, and storage stabilities of the rinse solutions are good. On the other hand, the rinse solutions of Comparative examples have a problem of melting, gel occurrence due to the small maximum dissolution quantity or problems of gel defects and storage stabilities even though there is no problem concerning properties such as pattern collapse margin, defects, and LWR.

Examples 21 to 25

Resist patterns were formed in the same manner as in Example 1 except for changing the amount of 3-hexene-2,5-diol (HXED) to 200 ppm (Example 21), 500 ppm (Example 22), 2,000 ppm (Example 23), 3,000 ppm (Example 24) and 5,000 ppm (Example 25) respectively. Measurement of collapse limit critical dimension, confirmation and evaluation of gel defects, and measurement of storage stabilities of the rinse solutions were conducted in the same manner as in Example 1. The results are shown in Table 5. In addition, results in Example 1 are also shown in Table 5 for reference.

TABLE 5

| | Additives of rinse solution | Amount (ppm) | Collapse limit CD (nm) | Gel defects | Storage stabilities |
|---|---|---|---|---|---|
| Example 21 | HXED | 200 | 194 | ◯ | ◯ |
| Example 22 | HXED | 500 | 185 | ◯ | ◯ |
| Example 1 | HXED | 1,000 | 158 | ◯ | ◯ |
| Example 23 | HXED | 2,000 | 146 | ◯ | ◯ |
| Example 24 | HXED | 3,000 | 172 | ◯ | ◯ |
| Example 25 | HXED | 5,000 | 189 | ◯ | ◯ |

As shown in Table 5, in Examples 21 to 25, good results concerning collapse limit critical dimension, gel defects, and storage stabilities were obtained as with Example 1 in comparison with when deionized water was used as a rinse solution.

Examples 26 to 30

Resist patterns were formed in the same manner as in Example 11 except for changing the amount of 3-hexene-2,5-diol (HXED) to 200 ppm (Example 26), 500 ppm (Example 27), 2,000 ppm (Example 28), 3,000 ppm (Example 29), and 5,000 ppm (Example 30) respectively. The existence or nonexistence of melting and LWR of resist patterns formed were evaluated in the same manner as in Example 11. The results are shown in Table 6. In addition, results in Example 11 are also shown in Table 6 for reference.

TABLE 6

| | Additives of rinse solution (Solvent: deionized water) | Amount (ppm) | Existence or nonexistence of melting | LWR | Storage stabilities |
|---|---|---|---|---|---|
| Example 26 | HXED | 200 | Nonexistence | Improved | ○ |
| Example 27 | HXED | 500 | Nonexistence | Improved | ○ |
| Example 11 | HXED | 1,000 | Nonexistence | Improved | ○ |
| Example 28 | HXED | 2,000 | Nonexistence | Improved | ○ |
| Example 29 | HXED | 3,000 | Nonexistence | Improved | ○ |
| Example 30 | HXED | 5,000 | Nonexistence | Improved | ○ |

As shown in Table 6, no melting was observed and LWRs were improved in every Examples 26 to 30. Further, storage stabilities were also improved in every Examples 26 to 30.

Example 31

Resist patterns were formed in the same manner as in Examples 1 and 11 except for using a rinse solution containing 1,000 ppm of 3-hexene-2,5-diol (HXED) and 100 ppm of acetic acid instead of the rinse solution containing 200 ppm of 3-hexene-2,5-diol (HXED). Collapse limit critical dimension (collapse limit CD), gel defects, storage stabilities of the rinse solution, existence of melting, and LWR were measured and evaluated in the same manner as in Examples 1 and 11. In addition, the evaluations of collapse limit critical dimension (collapse limit CD) and gel defects were conducted on DX6270P and the evaluations of pattern melting and LWR were conducted on the EUV resist as with Examples 1 and 11. The results are shown in Table 7.

Examples 32 to 38

Resist patterns were formed in the same manner as in Example 31 except for using respectively 1,000 ppm of monoethanolamine (Example 32), 1,000 ppm of 2-propanol (Example 33), 100 ppm of ADEKA Pluronic L-64 (Example 34), 100 ppm of acetic acid and 1,000 ppm of monoethanolamine (Example 35), 100 ppm of acetic acid and 1,000 ppm of 2-propanol (Example 36), 1,000 ppm of monoethanolamine and 100 ppm of ADEKA PLURONIC L-64 (Example 37), and 1,000 ppm of 2-propanol and 100 ppm of ADEKA PLURONIC L-64 (Example 38) instead of 100 ppm of acetic acid. Collapse limit critical dimension (collapse limit CD), gel defects, storage stabilities of the rinse solution, existence of melting, and LWR were measured and evaluated in the same manner as in Examples 31. The results are shown in Table 7.

In addition, ADEKA Pluronic L-64 (manufactured by ADEKA CORPORATION) is a compound represented by the formula:

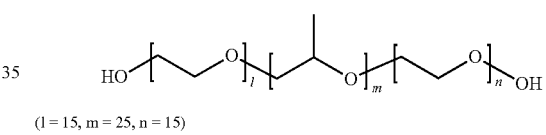

(l = 15, m = 25, n = 15)

TABLE 7

| Example | Additives of rinse solution and amount thereof | Collapse limit CD (nm) | Gel defects | Existence or nonexistence of melting | LWR | Storage stabilities |
|---|---|---|---|---|---|---|
| 31 | HXED 1,000 ppm<br>Acetic acid 100 ppm | 155 | ○ | Nonexistence | Improved | ○ |
| 32 | HXED 1,000 ppm<br>Monoethanolamine 1,000 ppm | 151 | ○ | Nonexistence | Improved | ○ |
| 33 | HXED 1,000 ppm<br>2-propanol 1,000 ppm | 154 | ○ | Nonexistence | Improved | ○ |
| 34 | HXED 1,000 ppm<br>ADEKA Pluronic L-64 100 ppm | 148 | ○ | Nonexistence | Improved | ○ |
| 35 | HXED 1,000 ppm<br>Acetic acid 100 ppm<br>Monoethanolamine 1,000 ppm | 154 | ○ | Nonexistence | Improved | ○ |
| 36 | HXED 1,000 ppm<br>Acetic acid 100 ppm<br>2-propanol 1,000 ppm | 155 | ○ | Nonexistence | Improved | ○ |
| 37 | HXED 1,000 ppm<br>Monoethanolamine 1,000 ppm<br>ADEKA Pluronic L-64 100 ppm | 147 | ○ | Nonexistence | Improved | ○ |
| 38 | HXED 1,000 ppm<br>2-propanol 1,000 ppm<br>ADEKA Pluronic L-64 100 ppm | 145 | ○ | Nonexistence | Improved | ○ |

It is found from Table 7 that in the rinse solutions of the present inventions, when an acid, an alkali, an organic solvent and/or another surfactant were further added to a rinse solution there are obtained improved effects of properties, for example, pattern collapse margin, defects, LWR and so on, which are almost equally with or more than those when rinse solutions containing conventional nonionic surfactants were used. Further, it is also found from Table 7 that pattern melting, which becomes evident conventionally when forming a fine pattern, is improved at the same time by used of rinse solutions of the present invention.

Example 39

A silicon wafer was treated with hexamethyldisilazane (HMDS) at 90° C. for 60 seconds and a chemically amplified PHS-acrylate hybrid EUV resist composition was spin-coated thereon. The wafer was soft-baked at 110° C. for 60 seconds to prepare a resist film having 50 nm in thickness. The wafer obtained was exposed to light by an EUV irradiation device NXE-3100 manufactured by ASML (NA=0.25, dipole) through a 24 nm mask size (L:S=1:1) while increasing an amount of exposure. It was then post-exposure baked (PEB) at 100° C. for 60 seconds and paddle-developed with a 2.38% TMAH aqueous solution for 30 seconds. After that, rinse water was begun to pour in a puddled state by the developer on the wafer, the rinse water was continued to pour while rotating the wafer to replace the developer with the rinse water, and the rotation of the wafer was stopped in a puddled state by the rinse water. Subsequently, a rinse solution consisting of deionized water containing 1,000 ppm of 3-hexene-2,5-diol (HXED) was introduced into the paddled water and the wafer was rotated at a very high speed to dry it. Collapse limit critical dimension (collapse limit CD) was measured and evaluated by the following measuring method. The result is shown in Table 8.
<Measurement of Collapse Limit Critical Dimension>

A pattern size (CD) to an exposure amount of pattern formed is measured at the place of 24 nm pattern and L/S=1/1 with an electron microscope Verity-4i manufactured by Applied Materials, Inc. and critical dimension of the pattern just before collapse is defined as collapse limit CD. When all of patterns were collapsed, it is evaluated as 'all collapsed' and when all of patterns were melted, it is evaluated as 'all melted'.

The collapse limit critical dimension of the resist pattern formed in Example 39 was 17.2 nm.

Existence of melting in the pattern formed above was confirmed and evaluated by the following method. The result is shown in Table 8.
<Confirmation and Evaluation of Melting>

A shot (an amount of exposure (Dose): 44 mJ/cm$^2$ or more) of 24 nm on a mask and L/S=1/1 in the pattern formed is observed using an electron microscope Verity-4i manufactured by Applied Materials, Inc. and existence of melting is confirmed. When a rectangle of pattern is maintained, it is evaluated as melting 'Nonexistence' and when melting is occurred in all patterns, it is evaluated as melting 'Existence', and when no evaluation can be performed due to an occurrence of swelling in a pattern, it is evaluated as 'Occurrence of pattern swelling'.

Evaluation of Example 39 was 'Nonexistence' as no melting was observed in the pattern of Example 39.

Further, LWR of the pattern formed above was measured and evaluated by the following method. The result is shown in Table 8.
<Measurement and Evaluation of LWR>

A shot (an amount of exposure (Dose): 38 mJ/cm$^2$ or more) of 24 nm on a mask and L/S=1/1 is observed using an electron microscope Verity-4i manufactured by Applied Materials, Inc. and LWR thereof is measured and improvement thereof to a LWR value (4.5 nm) when deionized water was used as a rinse solution is confirmed. When improved, it is evaluated as 'Improved' and if not improved, it is evaluated as 'Not improved'. When no evaluation can be performed due to an occurrence of melting, it is evaluated as 'All melted'.

The evaluation of Example 39 was 'Improved' as LWR thereof was improved.

Examples 40 to 42

Resist patterns were formed in the same manner as in Example 39 except for using respectively 500 ppm of a nonionic surfactant, 3-hexene-2,5-diol (HXED) (Example 40), 1,000 ppm of 3,6-dimethyl-4-octyn-3,6-diol (DMOD) (Example 41), and 1,000 ppm of 3-hexene-2,5-diol (HXED) and 100 ppm of ADEKA Pluronic L-64 (Example 42) instead of 1,000 ppm of a nonionic surfactant 3-hexene-2,5-diol (HXED). Collapse limit critical dimension (collapse limit CD), existence of melting, and LWR of the resist pattern formed were measured and evaluated in the same manner as in Example 39. The results are shown in Table 8.

TABLE 8

| Example | Additives of rinse solution and amount thereof | Collapse limit CD (nm) | Existence or nonexistence of melting | LWR |
|---|---|---|---|---|
| 39 | HXED 1,000 ppm | 17.2 | Nonexistence | Improved |
| 40 | HXED 500 ppm | 18.9 | Nonexistence | Improved |
| 41 | DMOD 1,000 ppm | 17.1 | Nonexistence | Improved |
| 42 | HXED 1,000 ppm ADEKA Pluronic L-64 100 ppm | 18.2 | Nonexistence | Improved |

From Table 8, it is found that by use of the rinse solution of the present invention, no melting occurs, LWRs are improved, and ultrafine resist patterns can be formed.

Comparative Example 17

A resist pattern was formed in the same manner as in Example 39 except for using deionized water as a rinse solution and collapse limit critical dimension (collapse limit CD) of the pattern was measured. Further, existence of melting in the resist pattern and LWR of the resist pattern were evaluated in the same manner as in Example 39. The results are shown in Table 9.

Comparative Examples 18 to 21

Resist patterns were formed in the same manner as in Example 39 except for using respectively 500 ppm of Surfynol 104 (SF104) (Comparative example 18), 1,000 ppm of 1,4-butanediol (Comparative example 19), 1,000 ppm of Surfynol 440 (SF440) (Comparative example 20), and 1,000 ppm of Surfynol 485 (SF485) (Comparative example 21) instead of 1,000 ppm of a nonionic surfactant 3-hexene-2,5-diol (HXED). Collapse limit critical dimension (collapse limit CD), existence of melting, and LWR of the resist pattern were measured and evaluated in the same manner as in Example 39. The results are shown in Table 9.

TABLE 9

| Comparative example | Additives of rinse solution and amount thereof | Collapse limit CD (nm) | Existence or nonexistence of melting | LWR |
|---|---|---|---|---|
| 17 | None | All collapsed | Nonexistence | (4.5 nm) |
| 18 | SF104 500 ppm | 20.4 | Nonexistence | Improved |
| 19 | 1,4-butanediol 1,000 ppm | All collapsed | Occurrence of pattern swelling | Improved |
| 20 | SF440 1,000 ppm | All melted | Existence | All melted |
| 21 | SF485 1,000 ppm | All melted | Existence | All melted |

As shown in Table 9, in other Comparative examples except for Comparative example 18, collapse of pattern, swelling of pattern, or melting were occurred. In addition, the rinse solution used in Comparative example 18 has problems of occurrence of gel and storage stabilities as shown in Table 2. The collapse limit critical dimension thereof was not enough compared to the rinse solutions of the present invention.

The invention claimed is:

1. A method for forming a pattern, comprising;
   (1) a step of forming a photosensitive resin composition layer by applying a photosensitive resin composition on a substrate,
   (2) a step of exposing the photosensitive resin composition layer,
   (3) a step of developing the exposed photosensitive resin composition layer, and
   (4) a step of rinsing the developed layer with a rinse solution for lithography after the development,
   wherein the rinse solution for lithography comprises water and a nonionic surfactant represented by the formula (I):

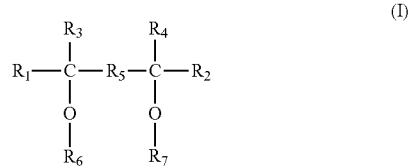

wherein, $R_1$ and $R_2$ may be the same as or different from each other and represent a hydrogen atom or a methyl group, $R_3$ and $R_4$ may be the same as or different from each other and represent a hydrogen atom, a methyl group or an ethyl group, $R_5$ represents a hydrocarbon group having 2 to 5 carbon atoms, in which one or more of a double bond or triple bond are contained, or a phenylene group, and $R_6$ and $R_7$ may be the same as or different from each other and represent a hydrogen atom or a methyl group.

2. The method for forming a pattern according to claim 1, wherein a maximum dissolution quantity in water of 25° C. of the nonionic surfactant represented by the formula (I) above is more than 5,000 ppm.

3. The method for forming a pattern according to claim 2, wherein the nonionic surfactant represented by the formula (I) above is contained in the rinse solution in a content of 0.02 to 0.5% by mass.

4. The method for forming a pattern according to claim 2, wherein the nonionic surfactant represented by the formula (I) above is contained in the rinse solution in a content of 0.02 to 0.5% by mass and further wherein at least one of an acid, a base, an organic solvent and a surfactant excluding a surfactant represented by the formula (I) is further contained.

5. The method for forming a pattern according to claim 2, wherein the nonionic surfactant represented by the formula (I) above is contained in the rinse solution in a content of 0.02 to 0.5% by mass and further wherein at least one of an acid, a base, an organic solvent and a surfactant excluding a surfactant represented by the formula (I) is further contained and further wherein at least one of an antimicrobial, an antibacterial, an antiseptic, and a fungicide is contained.

6. The method for forming a pattern according to claim 1, wherein the nonionic surfactant represented by the formula (I) above is at least one selected from 3-hexene-2,5-diol, 1,4-butynediol, 3-hexyne-2,5-diol, 2,5-dimethyl-3-hexyne-2,5-diol, 3,6-dimethyl-4-octyn-3,6-diol, 2,4-hexadiyn-1,6-diol, 1,2-benzenedimethanol, 1,3-benzenedimethanol, p-xylylene glycol, and 4-bis(methoxymethyl)benzene.

7. The method for forming a pattern according to claim 1, wherein the nonionic surfactant represented by the formula (I) above is contained in the rinse solution in a content of 0.02 to 0.5% by mass.

8. The method for forming a pattern according to claim 1, wherein at least one of an acid, a base, an organic solvent and a surfactant excluding a surfactant represented by the formula (I) is further contained.

9. The method for forming a pattern according to claim 1, wherein at least one of an antimicrobial, an antibacterial, an antiseptic, and a fungicide is further contained.

10. The method for forming a pattern according to claim 1, wherein the photosensitive resin composition is a chemically amplified photosensitive resin composition and the exposure is an exposure with an extreme ultra violet ray.

11. The method for forming a pattern according to claim 1, wherein the nonionic surfactant represented by the formula (I) above is at least one selected from 3-hexene-2,5-diol, 1,4-butynediol, 3-hexyne-2,5-diol, 2,5-dimethyl-3-hexyne-2,5-diol, 3,6-dimethyl-4-octyn-3,6-diol, 2,4-hexadiyn-1,6-diol, 1,2-benzenedimethanol, 1,3-benzenedimethanol, p-xylylene glycol, and 4-bis(methoxymethyl)benzene and is contained in the rinse solution in a content of 0.02 to 0.5% by mass.

12. The method for forming a pattern according to claim 1, wherein the nonionic surfactant represented by the formula (I) above is at least one selected from 3-hexene-2,5-diol, 1,4-butynediol, 3-hexyne-2,5-diol, 2,5-dimethyl-3-hexyne-2,5-diol, 3,6-dimethyl-4-octyn-3,6-diol, 2,4-hexadiyn-1,6-diol, 1,2-benzenedimethanol, 1,3-benzenedimethanol, p-xylylene glycol, and 4-bis(methoxymethyl)benzene and is contained in the rinse solution in a content of 0.02 to 0.5% by mass and further wherein at least one of an acid, a base, an organic solvent and a surfactant excluding a surfactant represented by the formula (I) is further contained.

13. The method for forming a pattern according to claim 1, wherein the nonionic surfactant represented by the formula (I) above is at least one selected from 3-hexene-2,5-diol, 1,4-butynediol, 3-hexyne-2,5-diol, 2,5-dimethyl-3-hexyne-2,5-diol, 3,6-dimethyl-4-octyn-3,6-diol, 2,4-hexadiyn-1,6-diol, 1,2-benzenedimethanol, 1,3-benzenedimethanol, p-xylylene glycol1, and 4-bis(methoxymethyl)benzene and is contained in the rinse solution in a content of 0.02 to 0.5% by mass and further wherein at least one of an acid, a base, an organic solvent and a surfactant excluding a surfactant represented by the formula (I) is further contained and further wherein at least one of an antimicrobial, an antibacterial, an antiseptic, and a fungicide is contained.

14. The method for forming a pattern according to claim 1, wherein $R_5$ represents a hydrocarbon group having 2 to 5 carbon atoms, in which one or more of a double bond or triple bond are contained.

15. The method for forming a pattern according to claim 1, wherein $R_5$ represents —CH=CH—, —C≡C—, or —C≡C—CH$_2$—C≡C—.

16. A manufacturing method of semiconductor devices, flat panel displays or color filters comprising the pattern forming method of claim 1.

* * * * *